United States Patent
Ghanayem et al.

(10) Patent No.: US 6,174,373 B1
(45) Date of Patent: Jan. 16, 2001

(54) NON-PLASMA HALOGENATED GAS FLOW PREVENT METAL RESIDUES

(75) Inventors: Steve Ghanayem, Sunnyvale; Moris Kori, Palo Alto; Maitreyee Mahajani, Santa Clara; Ravi Rajagopalan, Sunnyvale, all of CA (US)

(73) Assignee: Applied Materials, Inc., Santa Clara, CA (US)

(*) Notice: Under 35 U.S.C. 154(b), the term of this patent shall be extended for 0 days.

(21) Appl. No.: 09/476,917

(22) Filed: Jan. 4, 2000

Related U.S. Application Data

(60) Division of application No. 08/942,582, filed on Oct. 2, 1997, which is a continuation-in-part of application No. 08/625,485, filed on Mar. 29, 1996, now Pat. No. 5,709,772.

(51) Int. Cl.⁷ .............................. C23C 16/00; H05H 1/00
(52) U.S. Cl. .................... 118/697; 118/695; 118/696; 118/719; 156/345
(58) Field of Search .................... 118/719, 697, 118/695, 696, 698, 699; 156/345

(56) References Cited

U.S. PATENT DOCUMENTS

| | | | |
|---|---|---|---|
| 4,617,087 | 10/1986 | Iyer et al. | 156/643 |
| 5,164,330 | 11/1992 | Davis et al. | 437/192 |
| 5,207,836 | 5/1993 | Chang | 134/1 |
| 5,462,603 | 10/1995 | Murakami | 118/719 |
| 5,516,367 | 5/1996 | Lei et al. | 118/725 |
| 5,520,742 | 5/1996 | Ohkase | 118/724 |
| 5,533,635 | 7/1996 | Man | 216/67 |
| 5,534,066 | 7/1996 | O'Neill et al. | 118/663 |
| 5,616,208 | * 4/1997 | Lee | 156/345 |
| 5,648,175 | * 7/1997 | Russell et al. | 428/427.3 |
| 5,709,772 | 1/1998 | Ghanayem et al. | 156/646.1 |
| 6,035,803 | * 3/2000 | Robles et al. | 118/723 E |

* cited by examiner

Primary Examiner—Richard Bueker
Assistant Examiner—P. Hassanzadeh
(74) Attorney, Agent, or Firm—Townsend and Townsend and Crew

(57) ABSTRACT

An apparatus and process for limiting residue remaining after the etching of metal in a semiconductor manufacturing process, such as etching back a tungsten layer to form tungsten plugs, by passivating the surface of a wafer with a halogen-containing gas are disclosed. The wafer is exposed to the halogen-containing gas in a chamber before a metal layer is deposited on the wafer. The exposure can occur in the same chamber as the metal deposition, or a different chamber. The wafer can remain in the chamber or be moved to another chamber for etching after exposure and deposition.

17 Claims, 3 Drawing Sheets

NON-PLASMA HALOGENATED GAS FLOW PREVENT METAL RESIDUES

CROSS REFERENCE TO A RELATED APPLICATION

This application is a division of 08/942,582, filed Oct. 2, 1997, which is a continuation in part of the application Ser. No. 08/625,485 entitled "Non-Plasma Halogenated Gas Plow to Prevent Metal Residues" by Steve G. Ghanayem, et al., filed Mar. 29, 1996, now U.S. Pat. No. 5,709,772 which is herein incorporated by reference for all purposes.

BACKGROUND OF THE INVENTION

The present invention relates to metal deposition on semiconductor substrates in semiconductor processing systems, and in particular to the elimination of residue remaining after the etching of the metal.

One of the steps in the formation of a semiconductor chip is the creation of metal interconnections between devices on a semiconductor wafer. Typically, this is done by first depositing a layer of metal, such as tungsten, across the wafer. In one process, tungsten is deposited in a chemical vapor deposition (CVD) chamber by reacting $WF_6$ containing the tungsten and $H_2$ or Silane at elevated temperatures over a wafer sitting on a resistive heater (alternately, other methods may be used to heat the wafer, such as lamps). The process temperature is typically 475° C. Subsequently, the tungsten is etched away except for areas in which metal interconnections are desired. This may be done in the same chamber or by moving the wafer to a separate chamber.

It has been discovered that under certain processing conditions, when the wafer is later etched, tungsten residue remains on the wafer, which can form shorts in the interconnects. Although the process is not completely understood, it is believed that tungsten may preferentially grow in certain spots on the wafer (These spots may be areas where residue has formed as a result of previous processing steps). The preferentially growing tungsten may be in a different phase than other areas of the metal tungsten layer. Because the tungsten is in a different phase, these areas may then etch away at a different rate, leaving the undesirable tungsten residue in areas where there should be no interconnect after the etch step.

One approach to eliminate the residue is to clean the chamber in which the metal layer is deposited after every wafer is processed. This is typically done by removing the wafer, and then igniting a plasma composed of $NF_3$, followed by a hydrogen plasma, with a subsequent argon gas purge. After this cleaning step, the next wafer can be inserted into the chamber for depositing of the tungsten layer without significant residue being present after etchback. A drawback of this plasma clean approach is that it requires a significant amount of time between each wafer being processed. One approach would be to do the plasma less often. But it has been discovered, for example, that a plasma clean after every 25 wafers is not sufficient since residue formation still occurs.

Accordingly, it would be desirable to have an improved process for eliminating residue formation after tungsten deposition and etchback which does not significantly impact wafer throughput.

SUMMARY OF THE INVENTION

The present invention provides an apparatus and process for limiting residue remaining after the etching of metal in a semiconductor manufacturing process by exposing a wafer to a halogen-containing gas without a plasma in a processing chamber. The wafer may be exposed to the remnants of a halogen-containing gas remaining in the chamber from before the wafer was loaded into the chamber, or halogen-containing gas may be injected onto the wafer before deposition of a metal layer. The exposure can occur in the same chamber as the metal deposition, or a different chamber. The wafer can remain in the chamber or be moved to another chamber for etching after exposure and deposition.

In one embodiment, the halogen-containing gas is $NF_3$ and is injected into the chamber between wafer processing steps, although other gases, such as $C_2F_6$, $CF_4$, $ClF_3$, or $Cl_2$ may be used. Preferably, the halogen-containing gas is injected for less than 30 seconds and at a rate of between 10–2000 sccm (more preferably between 10–150 sccm) with a pressure between 50 milliTorr (mT) and 90 Torr (T) (more preferably, between 50 mT and 10 T), but the halogen-containing gas may be injected for up to 150 seconds. A longer injection period would be appropriate with a batch reactor, for example. In general, it is desired that the injection period be short, relative to the total clean time.

In another embodiment, a halogen-containing gas is injected onto the wafer after the wafer has been loaded into the chamber. The halogen-containing gas is $WF_6$, and serves as a fluorine source that prevents metal residue after a subsequent deposition and etch step.

In yet another embodiment, a plasma chamber cleaning operation is performed after a number of deposition steps. The plasma is formed from a halogen-containing gas, for example, $NF_3$. The plasma is maintained to "overetch" the chamber, that is, the plasma is maintained beyond the time required to clean unwanted residue from the chamber. It is believed that the plasma provides a source of fluorine during the overetch step, and that the fluorine is adsorbed onto the walls of the chamber. The walls of the chamber subsequently provide fluorine to passivate the surface of wafers during metal depositions.

For a further understanding of the nature and advantages of the invention, reference should be made to the ensuing description taken in conjunction with the accompanying drawings.

DESCRIPTION OF THE PREFERRED EMBODIMENTS

Figure 1:
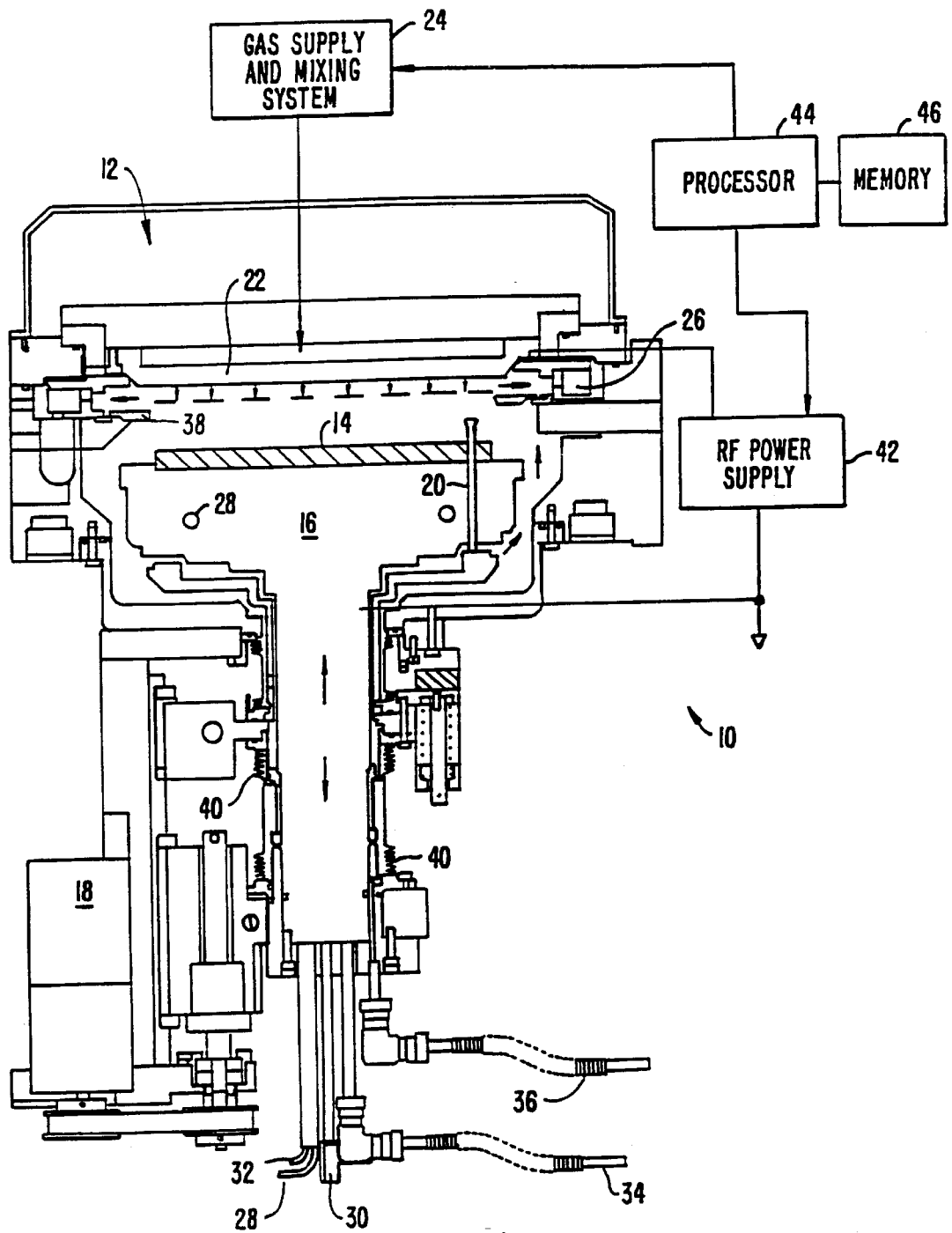
FIG. 1 is a diagram of a semiconductor wafer processing system used in one embodiment of the present invention.

One suitable system for carrying out the present invention is shown in FIG. 1, which is a diagram of a semiconductor substrate processing system 10 including a cross-sectional view, partially schematic, of a CVD chamber 12. A substrate 14 is shown sitting on a heater mount 16. The substrate is brought into chamber 12 by a robot blade through a slit valve in the sidewall of the chamber (not shown). Chamber 12 may be part of a vacuum processing system having a plurality of processing chambers connected to a central transfer chamber. The heater mount 16 is movable vertically using a motor 18. The substrate 14 is brought into the chamber when the heater mount 16 is in a first position opposite the slit valve. The substrate 14 is supported initially by a set of pins 20 that pass through the heater mount 16. When the heater mount 16 is raised to a processing position, the wafer is lifted off of the pins. A gas distribution plate 22 provides process gases into chamber 12. Gases are provided from a gas supply and mixing system 24. An exhaust system 26 evacuates the reaction byproducts and unreacted gases.

Wafer 14 is heated during the process by a resistive coil 28 embedded in the heater mount 16. Coil 28 exits the heater mount 16 at the bottom of FIG. 1 and is connected to an external power supply (not shown). The bottom of FIG. 1 also shows a thermocouple connection 30 for measuring the temperature of the heater mount 16. Also shown is a vacuum line 32 which connects to recesses (not shown) on the top of heater mount 16 for holding wafer 14 in place.

A pair of purge lines, 34 and 36 are shown for providing purge gases. Purge gas line 34 provides a purge gas which comes up around the edges of heater mount 16 and past purge guide 38, which will form a small gap between it and wafer 14 in the processing position. This purge gas prevents any tungsten from depositing on the backside or edges of wafer 14. Additional purge line 36 is used to keep any residue from collecting around stainless steel bellows 40 which provide a barrier between the mechanical mechanisms and the chamber interior.

The process performed in chamber 12 can either be a CVD process, or a plasma enhanced CVD (PECVD) process. In a PECVD process, RF power is applied between gas distribution plate 22 and heater mount 16 by an RF power supply 42. Typically, heater mount 16 is grounded, with the positive voltage being applied by a strap to a support plate for gas distribution plate 22. RF power supply 42 can supply either single or mixed RF power to enhance the decomposition of reactive species introduced into chamber 12.

A processor 44 controls the operation of the chamber, in particular the RF power supply and the gas supply and mixing system 24. The processor uses a memory 46 which stores a program containing instructions for operation of the system. In addition, the processor can control a gas injection source through gas mixing system 24. The processor also controls the purge lines, a vacuum pump connected to the vacuum lines for holding the wafer, and the vacuum exhaust system. The processor also receives a signal from the thermocouple 30 to provide feedback for control of the power supply connected to coil 28 for providing the desired temperature through resistive heating. Additionally, processor 44 can control motor 18 for moving the heater mount 16 as desired, as well as the robot arm (not shown).

It is desirable to process as many wafers as possible during a given period of time. However, as discussed above, periodic chamber cleans are typically performed to remove deposits on the interior of the chamber. Chamber cleans are not done after each deposition for at least two reasons. First, a typical clean involves striking a plasma in the chamber between wafer depositions and waiting until the unwanted deposits are removed from the surfaces of the chamber. Such a cleaning step takes time away from wafer production. Second, a plasma clean changes the environment of the chamber.

One type of periodic chamber clean is a plasma clean using a halogenated precursor gas, such as $NF_3$. The plasma dissociates the $NF_3$ into reactive plasma species, including fluorine ions and fluorine free radicals. During the chamber cleaning process, the reactive plasma species combine with the unwanted deposits to form compounds that are removed by the chamber exhaust system. Various methods may be used to determine the endpoint of the cleaning process, that is, when all of the unwanted deposits have been removed. One such method measures the spectral emissions of the glow discharge of the plasma, and ends the cleaning process when the spectra corresponding to emissions from elements present in the deposits drop below a selected level.

Generally, it is desirable to stop the inter-wafer plasma cleaning process after the unwanted deposits have been removed. However, an unexpected benefit has been observed when the chamber is "overetched." Overetching a chamber involves maintaining a plasma from the halogenated precursor for a longer period of time than is necessary to remove the unwanted deposits from the chamber. Overetching a chamber provides benefits similar to treating a wafer with a non-plasma halogenated gas prior to deposition. Specifically, overetching a chamber reduces unwanted residue on the surface of wafers processed after the overetching has occurred. It is believed that free fluorine liberated during the overetch period of the chamber plasma clean process adsorbs on the chamber surfaces, and that this adsorbed fluorine subsequently passivates the surface areas of wafers where a residue might otherwise occur.

The beneficial effects of the overetch period provided superior results, i.e., reduced residue, for a number of wafers that were processed with deposition and etch steps subsequent to the overetch clean. In a specific example, a processing chamber was overetched for a period of 180 seconds with a plasma formed from $NF_3$, but it is believed that the desired effect would be obtained for overetch periods as short as 15 seconds and as long as 300 seconds. Subsequently, wafers were processed in that chamber by first forming a 7000 Å thick layer of tungsten from $WF_6$ and $H_2$ using a thermal CVD process. The wafers were then etched back to form tungsten plugs in pre-existing interconnection vias in the wafer. The beneficial effects of overetching the chamber were seen for 25 wafers processed after the overetch process. It is believed that this number of wafers can be increased, to a limit, by increasing the plasma density during the overetch period and/or increasing the overetch period. Therefore, it appears that increasing the overetch period increases the amount of fluorine adsorbed onto the chamber surfaces that is subsequently available for wafer surface passivation.

The beneficial effects of passivating a surface with a halogen-containing gas were seen subsequent to a "blanket" etchback, as described above in connection with a tungsten-plug process. It is expected that a similar benefit would be obtained when etching a patterned layer of metal. In a patterned etchback, the wafer would be passivated with a halogen-containing gas prior to depositing a layer of metal, such as tungsten. Then, the wafer would be removed from the chamber to a lithography line where, typically, a resist would be applied to the wafer, exposed, and developed to form a resist pattern on the metal layer. The wafer with the patterned resist layer would then be etched, as by placing the wafer in an etch chamber. Passivating the wafer prior to deposition of the metal layer would reduce the residue remaining after the etch step. In a blanket etchback process, the wafer could be etched-back in the same chamber the metal was deposited in, but is typically moved to another chamber in a multi-chamber processing system, or moved to another chamber in another system.

Figure 2A:
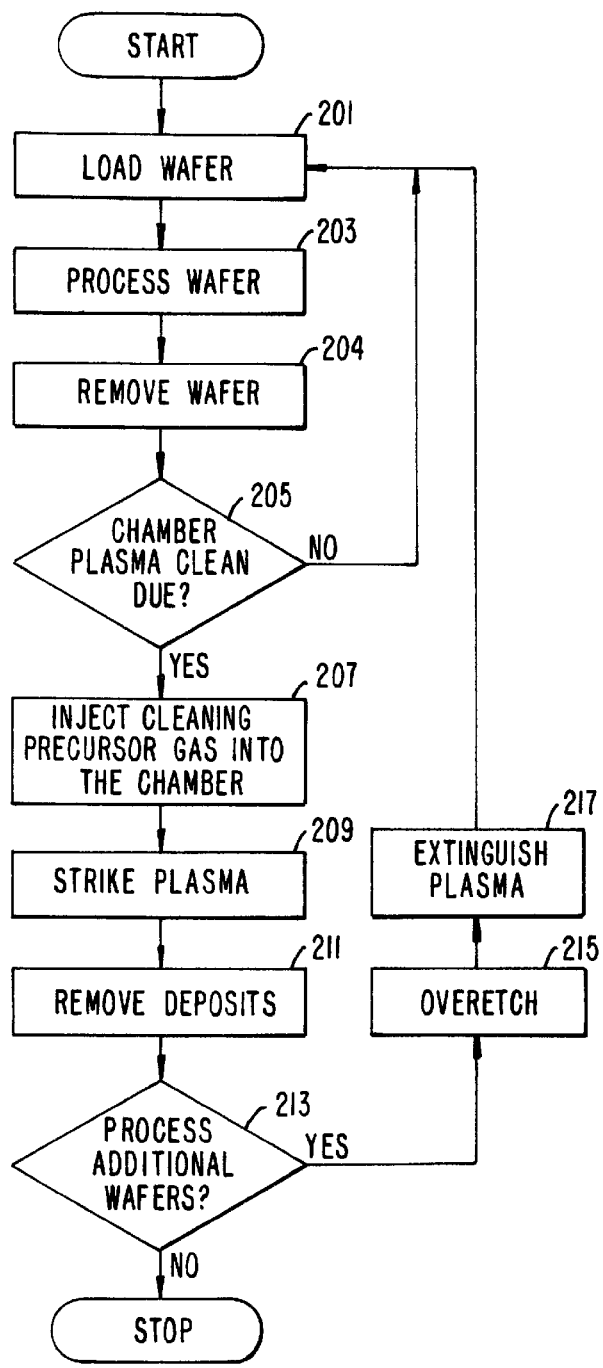
FIG. 2A is a flowchart of a process according to an embodiment of the present invention using an overetch technique.

FIG. 2A is a simplified flowchart illustrating one embodiment of the present invention used in the chamber of FIG. 1. After a wafer is loaded into the chamber (step 201) it is processed by depositing a metal layer onto the wafer (step 203). The wafer is then removed from the chamber (step 204) and a determination is made whether a chamber plasma clean is due (step 205). This determination may be made based upon the number of wafers processed, for example, after 25 wafers, or may be based upon the total thickness of metal deposited since the previous chamber clean, or other parameters. If a chamber clean is not due, another wafer is loaded and processed. If a chamber clean is due, cleaning precursor gas is injected into the chamber (step 207) and a plasma is struck (step 209). The plasma is maintained for a time period sufficient to remove the deposits from the chamber (step 211). In this instance, the plasma is maintained for 600 seconds at a chamber pressure of 350 mTorr and a plasma energy density of 1.9 W per $cm^2$.

A determination is made whether more wafers are to be processed (step 213). If no more wafers are to be processed, the process is stopped. If additional wafers are to be processed, the plasma is maintained for an overetch period (step 215) of 30–180 seconds. It is believed that halogen species from the plasma become adsorbed onto the surfaces of the chamber. After the chamber is overetched, the plasma is extinguished (step 217) before loading another wafer and proceeding. A reduction in residue remaining after a metal etch process was observed on 25 wafers that were processed in a chamber following the above overetch process.

Another way to passivate the surface of a wafer with a halogen to reduce unwanted residue from a subsequent deposition and etch process is to expose the wafer to a halogenated gas prior to the deposition step. This exposure may be indirect, as from remnants of a halogen-containing gas remaining in the chamber after a chamber cleaning process or injected into the chamber at the end of a deposition process, or may be direct, such as flowing non-plasma halogenated gas directly on the surface of the wafer, prior to initiating deposition.

Figure 2D:
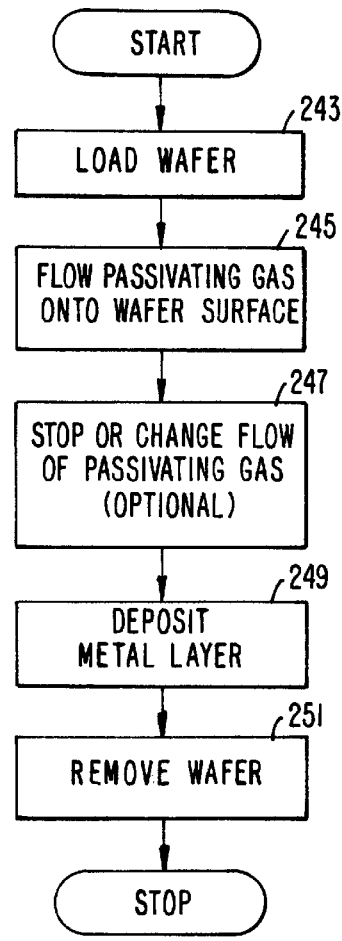
FIG. 2D is a flowchart of a process according to an embodiment of the present invention using a direct exposure method.
Figure 2B:
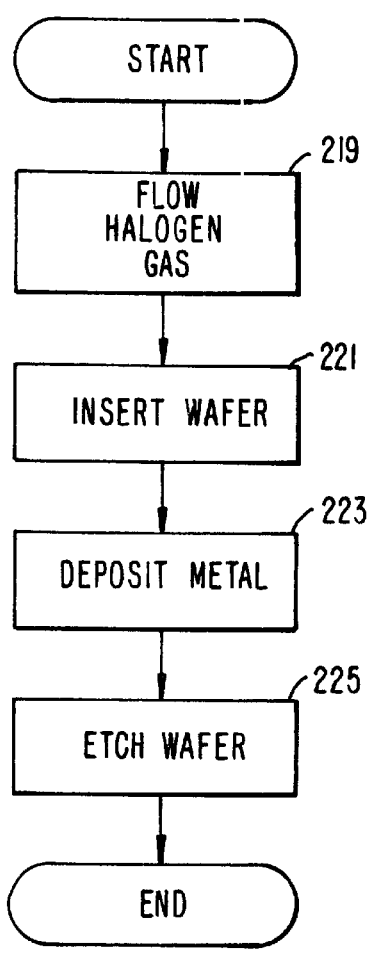
FIG. 2B is a flowchart of a process according to an embodiment of the present invention using an indirect exposure method.

FIG. 2B is a flowchart illustrating one embodiment of the present invention used in the chamber of FIG. 1. It should be understood that other chambers or systems could be used to implement the present invention. First, halogen-containing gas is flowed to the chamber by a command from the processor 44 to the appropriate valves in gas supply and mixing system 24 (step 219). Subsequently, a wafer is inserted into the chamber by a robot arm under control of the processor (step 221). Next, a layer of metal, preferably tungsten, is deposited on the wafer (step 223). Next, the wafer is etched, either in the same chamber or in a different chamber or different system (step 225). Alternatively or additionally, a halogen-containing gas may be injected into the chamber after the metal layer is deposited on the wafer, thus providing remnants of halogen-containing gas in the chamber to passivate the surface of a subsequent wafer.

Figure 2C:
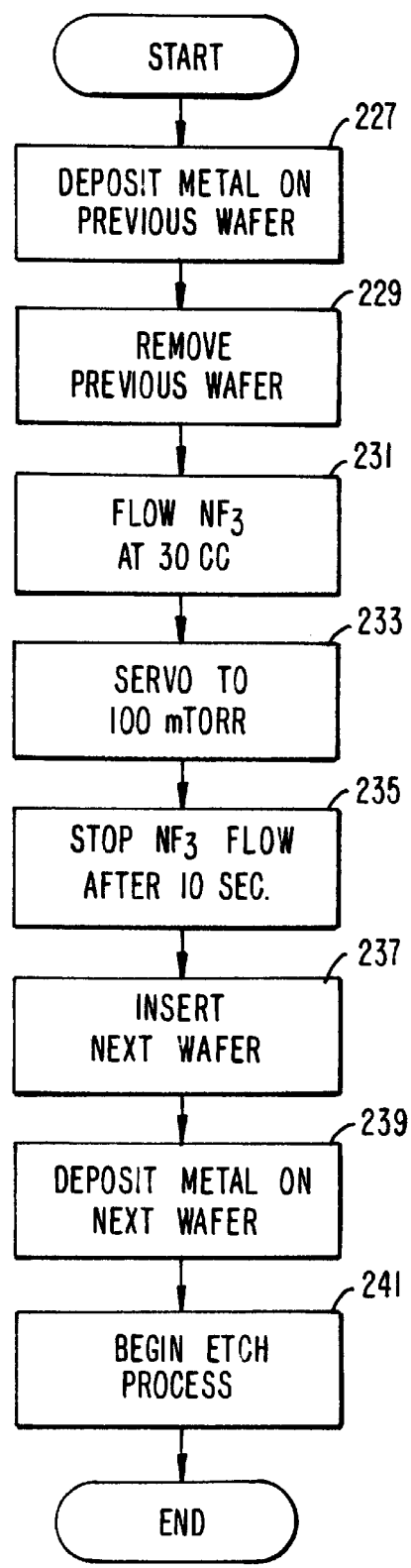
FIG. 2C is a more detailed version of the flowchart of FIG. 2B.

FIG. 2C is a more detailed flowchart of the embodiment illustrated in FIG. 2B. After depositing the metal on the previous wafer in the chamber (step 227), the previous wafer is removed (step 229). $NF_3$ is then flowed at a flow rate of approximately 30 sccm by control of a valve in the gas supply and mixing system by the processor (step 231). Alternately, flow rates between 10 and 2000 sccm or more preferably between 10 and 150 sccm may be used, as controlled by an instruction in memory 46 executed by processor 44.

During this flow, the chamber pressure is controlled to a preferred value of approximately 100 mT by using feedback control of a step motor controlling a vacuum valve to a pressure set by the processor (step 233). Alternately, pressures between 50 mT and 90 T or more preferably between 50 mT and 10 T may be used, as directed by an instruction in the program memory. The feedback control is accomplished by controlling a servo valve on the vacuum system so that the gas being introduced is evacuated at a rate which provides the desired pressure.

After approximately 10 seconds, the flow of $NF_3$ is stopped (step 235). Alternately, the flow of $NF_3$ may be maintained for anywhere from 2–150 seconds, as directed by an instruction in the program memory. The next wafer is then introduced into the chamber (step 237) and metal is deposited (step 239). Subsequently, the etch process is performed (step 241).

Alternately, other fluorinated or chlorinated gases such as $ClF_3$, $C_2F_6$, $CF_4$, $Cl_2$, etc. may be used. In addition, the wafer may be etched in the same chamber or a different chamber and the $NF_3$ gas may be injected either with the wafer in the chamber or with the wafer outside of the chamber. In some process sequences, it is desireable to inject the halogen-containing gas after the layer of metal has been deposited. This allows the injection of a passivating gas to be included in the deposition sequence, eliminating the need for an independent gas flow control sequence, and provides gas remnants in the chamber to passivate the next wafer to have a metal layer deposited in that chamber. The wafers may be transferred to another chamber for the etchback step.

It is believed that the exposure of the wafer to a halogen species before depositing a tungsten layer prevents residue from remaining after the subsequent etching step. Although the exact mechanism is not completely understood, it is believed that the halogen species may adsorb on the surface over certain sites where tungsten preferentially grows. Thus, the adsorbed halogen passivates those sites and allows complete removal of the tungsten during the subsequent etch process.

The $NF_3$ residues which have been absorbed on the wafer surface thus apparently prevent out-of-phase growth of tungsten on that particular wafer being processed. Thus, the $NF_3$ injection step of the present invention will prevent residue from affecting a subsequently introduced wafer into the chamber.

As an alternative to exposing a wafer to remnants of halogenated gas in a chamber, a halogenated gas was flown directly over the surface of the wafer to passivate the areas of the wafer that might otherwise grow metal that would not be removed in a subsequent etch step. For example, $NF_3$ was flown onto the surface of the wafer for a period of time prior to the onset of the deposition step. The $NF_3$ was flown into the chamber from the gas head over the surface of the wafer at a flow rate of 30–150 sccm. The chamber pressure was 50 mT to 10 T and the flow was maintained for 5–30 seconds, before the flow of the passivating gas was shut off and wafer processing continued.

In another example, $WF_6$ was flown over the surface of a wafer prior to a deposition step to passivate the surface of the wafer. In this instance the $WF_6$ was used as a fluorine source, rather than a source of tungsten. In the deposition step, a reducing agent, such as silane or hydrogen gas, was added to the chamber to initiate deposition of tungsten.

FIG. 2D is a flowchart of a wafer passivating process where the passivating gas is flown directly onto the wafer prior to metal deposition. A wafer is loaded into the chamber (step 243) and a passivating gas is flown over the surface of the wafer (step 245) from the gas discharge head. If a different passivating gas, such as NF$_3$, were used, it may be appropriate to stop the flow of the passivating gas altogether. Furthermore, if the same gas is used to passivate the surface of the wafer and to deposit the metal layer, it may be possible to maintain the same gas flow. Hence, the step of changing the flow of the passivation gas (step 247) is optional. After the metal layer was deposited, the wafer was removed from the chamber (step 251). Subsequently, the wafer was etched back. The metal residue remaining after the etch process was less than the metal residue typically seen on an unpassivated wafer.

While it has been recognized that WF$_6$ may be used as a tungsten source to nucleate sites where it is desirable to deposit tungsten, in the process illustrated by the flowchart of FIG. 2D WF$_6$ is being used as a fluorine source to passivate the surface of the wafer to reduce subsequent residue after deposition and etch steps. The deposition step that follows the wafer surface passivation step typically deposits a layer of tungsten over the entire surface of the wafer. Surface passivation results in fewer shorting interconnections and other defects arising from residual tungsten when that layer of tungsten is patterned in an etch step.

Alternate embodiments of the invention are also possible. For instance, instead of the halogen gas flow being injected before every wafer, the processor could control the gas supply and mixing system to inject the halogen gas before every second, third, fourth, fifth or other number of wafers (or before such numbers of wafer). In addition to the NF$_3$ flow of the present invention, a plasma clean operation can still be performed under control of the processor after a number of wafers have been processed, for instance, 25. Another embodiment of combined passivation techniques, such as overetching a chamber during a cleaning process and directly or indirectly exposing a process wafer to passivating gas prior to deposition.

As will be understood by those with skill in the art, the present invention may be embodied in other specific forms without departing from the spirit or essential characteristics thereof. For example, lamp-heated chambers could be used instead of resistively-heated chambers for processing the wafers. Accordingly, the above description is intended to be illustrative, but not limiting, of the scope of the invention which is set forth in the following claims.

What is claimed is:

1. A substrate processing apparatus comprising:
    a substrate processing chamber;
    a gas distribution system configured to introduce gases into said substrate processing chamber;
    a substrate transfer system configured to transfer substrates into and out of said substrate processing chamber;
    a plasma generation system configured to form a plasma within said substrate processing chamber;
    a controller adapted to control said gas distribution system, said plasma generation system and said substrate transfer system; and
    a memory, operatively coupled to said controller, that stores a computer-readable program, said computer readable program including computer instructions that:
    (i) control said substrate transfer system to transfer a first substrate into said chamber, control said gas distribution system to flow a metal deposition gas into said chamber to deposit a metal layer over said first substrate and control said substrate transfer system to transfer said first substrate out of said chamber;
    (ii) thereafter, control said gas distribution system to flow a halogen-containing etchant gas into said substrate processing chamber and control said plasma generation system to form a plasma from said etchant gas, said etchant gas being flowed into said chamber and said plasma formed within said chamber for a selected period of time after said chamber is cleaned of deposits in order to overetch said chamber; and
    (iii) thereafter, control said substrate transfer system to transfer a second substrate into said substrate processing chamber so that said second substrate is exposed to remnants of said halogen-containing etchant gas and control said gas distribution system to flow a metal deposition gas into said substrate processing chamber to deposit a layer of metal over said substrate.

2. The apparatus of claim 1 wherein said halogen-containing gas comprises fluorine.

3. The apparatus of claim 2 wherein said halogen-containing further comprises chlorine.

4. The apparatus of claim 2 wherein said halogen containing gas is NF$_3$.

5. The apparatus of claim 1 wherein said selected period of time is between about 30–300 seconds.

6. The apparatus of claims 1 further comprising a pressure-control system, controllable by said controller, capable of establishing and maintaining a selected pressure in the chamber, and wherein said program further includes computer instructions for establishing and maintaining a pressure within the chamber while said halogen-containing etchant is flowed into said chamber of between about 100 mTorr–2 Torr.

7. The apparatus of claim 1 wherein said metal deposition gas comprises tungsten and wherein said layers of metal deposited over said first and second substrates are tungsten layers.

8. A substrate processing apparatus comprising:
    a substrate processing chamber;
    a gas distribution system configured to introduce gases into said substrate processing chamber;
    a substrate transfer system configured to transfer substrates into and out of said substrate processing chamber;
    a controller adapted to control said gas distribution system and said substrate transfer system; and
    a memory, operatively coupled to said controller, that stores a computer-readable program, said computer readable program including computer instructions that:
    (i) control said gas distribution system to flow a halogen containing gas into said substrate processing chamber and then stop said flow of said halogen-containing source;
    (ii) thereafter, control said substrate transfer system to transfer a substrate into said substrate processing chamber so that said wafer is exposed to remnants of said halogen-containing gas; and
    (iii) control said gas distribution system to flow a metal deposition gas into said substrate processing chamber to deposit a layer of metal over said substrate.

9. The apparatus of claim 8 wherein said halogen-containing gas comprises fluorine.

10. The apparatus of claim 9 said halogen containing gas comprises NF$_3$.

11. The apparatus of claim 9 herein said halogen-containing gas further comprises chlorine.

12. The apparatus of claim 8 wherein said program controls said gas distribution system to flow said halogen-containing gas into said chamber for between about 2–150 seconds before said substrate is transferred into said chamber.

13. The apparatus of claim 12 wherein said program controls said gas distribution system to flow said halogen-containing gas into said chamber at a rate of about 10–2000 sccm.

14. The apparatus of claim 8 wherein said apparatus further comprises a pressure-control system, controllable by said controller, capable of establishing and maintaining a selected pressure in the chamber, and wherein said program further comprises instructions for controlling said pressure control system to maintain said chamber at a pressure between about 50 millitorr–90 torr while said halogen-containing gas is flowed into said chamber.

15. The apparatus of claim 8 wherein said metal deposition gas comprises tungsten and said layer of metal is a tungsten layer.

16. The substrate processing apparatus of claim 8 wherein said halogen-containing gas is a halogen-containing, non-metal containing gas.

17. The substrate processing apparatus of claim 8 wherein said program further includes instructions to, before said halogen-containing gas is flowed into said chamber, control said substrate transfer system to transfer a second substrate into said chamber, control said gas distribution system to flow a metal deposition gas into said chamber to deposit a metal layer over said second substrate and control said substrate transfer system to transfer said second substrate out of said chamber.

* * * * *